United States Patent [19]

Dreschhoff et al.

[11] Patent Number: 4,929,489
[45] Date of Patent: May 29, 1990

[54] METHOD OF MAKING AND USING SELECTIVE CONDUCTIVE REGIONS IN DIAMOND LAYERS

[76] Inventors: Gisela A. M. Dreschhoff; Edward J. Zeller, both of 2908 W. 19th St., Lawrence, Kans. 66044

[21] Appl. No.: 321,219

[22] Filed: Mar. 9, 1989

Related U.S. Application Data

[63] Continuation of Ser. No. 75,393, Jul. 20, 1987, abandoned.

[51] Int. Cl.⁵ .............................................. B32B 9/00
[52] U.S. Cl. ........................... 428/195; 428/408; 428/901; 428/409; 250/492.3; 430/311; 430/313; 430/945
[58] Field of Search ............... 250/492.21; 430/311, 430/313, 945; 428/195, 408, 409, 901

[56] References Cited

U.S. PATENT DOCUMENTS 3,123,511 3/1964 Coleman ............................ 156/272
3,383,567 5/1968 King et al. ......................... 317/234
4,200,506 4/1980 Dreschhoff et al. ........ 204/157.1 H
4,277,293 7/1981 Nelson et al. ..................... 148/175
4,511,445 4/1985 Forrest et al. ............... 204/158 HR

FOREIGN PATENT DOCUMENTS 0113985 11/1983 Japan .

OTHER PUBLICATIONS

"Hackh's Chemical Dictionary", Fourth Edition, p. 306 (1985).

Primary Examiner—Patrick Ryan
Attorney, Agent, or Firm—Barnes & Thornburg

[57] ABSTRACT

A diamond lattice substrate is irradiated with a high energy particle of sufficient flux, energy level and time period to irreversibly transform an area of a plane normal to the axis of irradition into conductive graphite. The substrate is cooled during irradiation to confine the graphite to the area of the plane at a desired depth within the substrate.

17 Claims, 1 Drawing Sheet

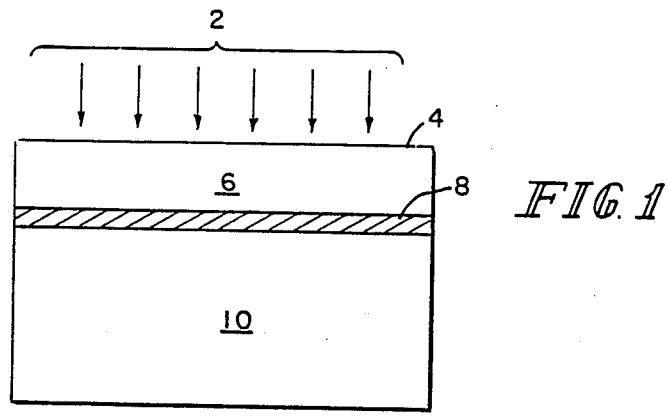
FIG. 1
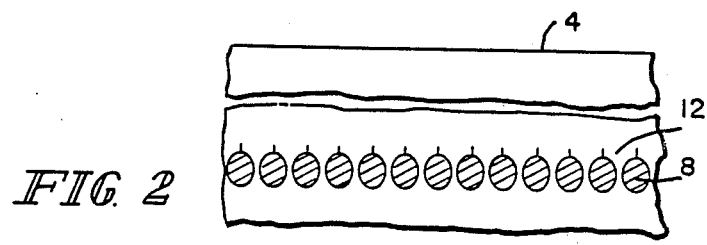
FIG. 2
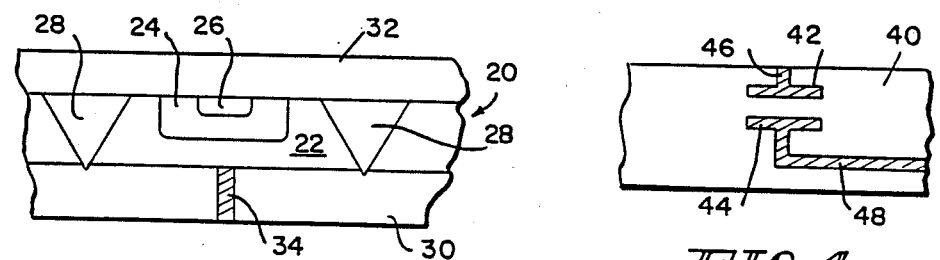
FIG. 3
FIG. 4
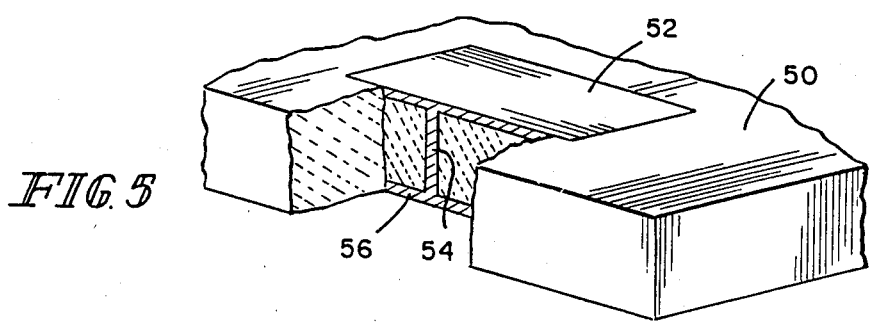
FIG. 5

METHOD OF MAKING AND USING SELECTIVE CONDUCTIVE REGIONS IN DIAMOND LAYERS

This is a continuation of application Ser. No. 075,393 filed July 20, 1987, now abandoned.

BACKGROUND AND SUMMARY OF THE INVENTION

The present invention relates generally to a method of producing conductive regions in a non-conductive material, and more specifically to forming conductive regions in a diamond lattice substrate.

We have been engaged in extensive research in the effect of high energy charge particle bombardment onto diamonds. As a result of this research, we obtained U.S. Pat. No. 4,200,506 directed to the use of high energy particle beams to produce identifying marks in gemstones, specifically diamonds. The highly localized alteration of the optical properties of the diamonds by introduction of very thin layers of radiation damage lattice is described therein.

With the advent of the successful growth of diamond films, we have turned our attention to the use of bombardment by high energy particle beams to create conductive graphite areas in diamonds. This application would have a widespread use in semiconductor devices, integrated circuits, miniaturized electrical devices and circuit boards, as well as memory devices. The relative resistance of diamond to radiation, as well as its high thermal conductivity would make it an ideal package, insulating layer, heat sink, etc., as compared to other materials presently being used with semiconductors. Similarly, by using a diamond package, optical communication to the interior of the package may be obtained.

The desirability of forming high conductive regions in insulative material is described in U.S. Pat. No. 4,511,455 to Forrest et al. Low resistivity material is obtained by irradiating carbon-containing materials with particles having atomic weight of at least one. This process involves the chemical break down of carbon-containing compounds by radiolysis caused by the impinging charged particles. The technique creates a cylindrical column of conducting amorphous type carbon. Although being applicable to generic carbon-containing materials, the Forrest et al. patent does not address specifically the properties of diamonds, their use in the electronic industry, and the ability to form conductive regions below the surface of the diamond.

Thus, it is an object of the present invention to provide a method of making selective conductive regions in a diamond substrate.

Another object of the present invention is to provide a method of making conductive regions in a diamond substrate below the surface of the substrate.

A still further object of the present invention is to provide a method of making conductive regions in a diamond substrate which is capable of being used in high-temperature, high-radiation environments.

These and other objects of the invention are obtained by irradiating a diamond lattice substrate with a high energy charged particle of sufficient flux, energy level and time period to irreversibly transform an area of a plane normal to the axis of irradiation into conductive graphite. The substrate is cooled during irradiation to confine the graphite to the area of the plane at a desired depth within the substrate. The irradiation is conducted for a period of a few minutes to a few hours, and at energy levels of 100 KeV to 4 MeV. The charged particles are selected from the group of protons, deuterons and alpha particles, although preferably being monoenergetic protons. The cooling is in the range of 4° K to room temperature.

The process is capable of producing contacts and interconnects on an integrated circuit for a device or on a circuit board. Similarly, it can form the plates of a capacitor and terminals on a container for electronic devices. It is also capable of forming resistors and other conductive elements through or in an insulative diamond layer.

Other objects, advantages and novel features of the present invention will become apparent from the following detailed description of the invention when considered in conjunction with the accompanying drawings.

BRIEF DESCRIPTION OF THE DRAWINGS

FIG. 1 is a diagrammatic cross-sectional view of a diamond lattice substrate that has been irradiated;

FIG. 2 is a diagrammatic magnified view of the diamond lattice substrate of FIG. 1;

FIG. 3 is a cross-sectional view of an integrated circuit having a diamond package layer with conductive terminal therein;

FIG. 4 is a cross-sectional view of a capacitor and resistor formed in a diamond layer; and FIG. 5 is a perspective view with cut away portions showing a circuit board incorporating the principles of the present invention.

DETAILED DESCRIPTION OF THE DRAWINGS

Referring now to FIG. 1, a diamond lattice substrate is illustrated that has been bombarded by a proton beam 2. As the protons enter the crystal through surface 4, they lose energy through ionization. The crystal lattice is not strongly heated and no changes occur in area 6 of the crystal. At the end of the proton particle's path, a change takes place in a very small and localized region of the crystal lattice shown as area 8. The remainder of the crystal is unchanged and shown herein as area 10.

FIG. 2 shows individual displacement spikes which is the change occurring in the small, localized area due to the intense heat produced when the proton particle stops. Each spike as shown may comprise an area of about 0.01 microns in diameter and involve about $10^4$ atoms. The area in which the displacement spikes are developed constitutes a permanent change that is detectable upon microscopic examination.

When natural diamond crystals are irradiated with monoenergetic protons from a Van de Graaff accelerator, permanent changes take place in the crystals at the point where the particles come to rest. If particle energies in the range from about 0.1 MeV to about 4 MeV are used, the crystal surface will not be damaged by sputtering nor will nuclear reactions occur which would render the diamond radioactive after completion of the treatment. The protons with which the diamond is bombarded will penetrate the crystal in a well defined and highly predictable manner stopping at a depth of a few microns to several tens of microns depending upon their initial energies. Energy levels in the range of about 0.7 MeV to 2 MeV are preferred. When the particles enter the crystals they first lose energy through ionization and the crystal lattice is not strongly heated. However, at the end of the particle's path a detectable change in the crystal lattice takes place in a very small and localized region. This region is characterized by the development of displacement spikes which result from the intense localized heating caused when the particle stops at the end of its path through the crystal. The zone in which the displacement spikes are developed constitutes a permanent change which is visible upon microscopic examination.

Cooling the crystal during irradiation keeps the bulk temperature low so that the structural changes occurring by the displacement spike is confined to a clearly defined zone. By maintaining the temperature in the range from room temperature to liquid helium temperature the desired effect is achieved. The temperature selected is a function of the energy level of particles and the desired thickness of the changed area. The lattice change in the stopping region causes the previously highly resistive or insulative portion of the crystal to become a lower resistance, conductive polymorph of carbon, namely graphite. The lateral extent of the pattern is defined by known masking techniques.

The depth of penetration of the protons into the crystal lattice is directly proportional to the energy level employed. Accordingly, it is possible to produce altered lattices at different depths below the crystal surface.

Single crystals of natural diamond were irradiated with protons ranging in energy from 0.7 MeV to 1.8 MeV. The particle beam was supplied by a Van de Graaff accelerator. Approximately $10^{16}$ particles per hour per $cm^2$ were incident upon the crystal with an average beam current of 1.5 microamperes. All irradiations were performed with a defocused beam so that the proton intensity distribution across the beam was as uniform as possible to eliminate formation of hot spots. High particles fluxes were avoided to prevent excessive heating of the target and it was cooled to liquid nitrogen temperature (77° K) during the irradiations. The duration of the irradiations ranged from a few minutes to several hours. The formation of a thin dark layer is very pronounced after irradiating for 30 minutes. Under these conditions of irradiation, the actual dimensions were approximately as follows:

Average thickness of the crystal: 1 to 2 mm.

Depth of the altered layer below the crystal surface: roughly 15 microns.

Thickness of the altered layer: approximately 1 micron or less.

The resistance of the diamond has been measured as greater than 250 mega ohms and the resistance of the altered layer has been measured as less than 500 ohms. This represents an increase in conductivity by a factor of more than $10^5$. The method of measuring is as follows:

Electrical contacts are placed against the diamond surfaces and across the conductive layers.

This technique may be used with electrical, electronic and integrated circuits. As illustrated in FIG. 3, an integrated circuit 20 having a collector region 22, a base region 24 therein and an emitter region 26. The semiconductor circuit 20 is divided into islands by, for example, a dielectric lateral isolation regions 28. The bottom of the substrate includes a diamond insulative layer 30 and the top includes a diamond insulative layer 32. The present method is used to form a conductive graphite contact region 34 extending through the bottom insulative diamond lattice 30 to the collector region 22. The structure in FIG. 3 may be later mounted into a packaging, or the regions 30 and 32 may represent the packaging. Thus, the graphite region 34 would be considered a terminal on the packaging.

A specific use of the electronic device illustrated in FIG. 3 would be an optical semiconductor device since the diamond layers 30 and 32 are optical transmitters. Thus, the device can be a light emitting diode or a photosensor. The use of the diamond layers 30 and 32 and the process of the present invention provides the ability to use the diamond layers and a method of forming electrical contacts to a semiconductor and integrated circuit within the package while allowing optical transmission.

The diamond layers 30 and 32 are also very resistant to radiation and provide good thermal conductivity. This removes the need for having heat sinks separate from the insulative layer, which in this case is the diamond layers 30 and 32. The method described above is carried out at varying levels of energy to produce the three-dimensional contact 34.

The present process can also be used to form electrical devices as illustrated in FIG. 4. The process is used in a diamond layer or substrate 40 to form capacitor plates 42 and 44 separated from each other by the unaltered diamond lattice. Conductor contact region 46 extends from the top plate 42 to the surface of the diamond substrate 40 and a resistive region 48 is formed in the diamond lattice using the method of the present invention.

The present process may also be used to form circuit boards which because they are formed of diamonds are capable of high heat environments. A diamond lattice circuit board 50 is illustrated in FIG. 5 as having a top conductor pattern 52 formed therein with a via or pass through conductive layer 54 connecting the top layer 52 to a bottom conductive pattern 56. The method of the present invention is used to form the top and bottom conductors 52 and 56, as well as the pass through or via 54.

The conductivity or resistivity of the individual graphite layers is a function of the amount of graphite lattice per unit area as well as the depth or cross-sectional area. The lateral restriction of the pattern is accomplished by well known masking methods using metal templates or by systems which are capable of transmitting a fine beam and moving it laterally. As discussed above, the depth or location of the conductive region within the body of the diamond crystal lattice is a function of the energy of the high energy particle beam, as well as the cooling step to confine it to a given plane.

With the advent of optical transmission for use in memory and microprocessors, the use of optically transparent diamonds and the ability to form conductors therein will become very useful.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. An electrical device comprising:
   a conductive region in a diamond lattice substrate including a zone of conductive graphite below the surface of the diamond lattice and formed by localized heating of the diamond substrate;

conductor contacts at the surface of said diamond substrate in current conducting communication with said conductive region; and a source of potential connected to said conductor contacts.

2. An integrated circuit comprising:

a conductive region in a diamond lattice substrate, including a zone of conductive graphite below the surface of the diamond substrate and formed by localized heating of the diamond substrate;

conductor contacts at the surface of said diamond substrate in current conducting communication with said conductive region; and a source of potential connected to said conductor contacts.

3. A circuit board comprising:

a conductive region in a diamond lattice substrate, including a zone of conductive graphite below the surface of the diamond substrate and formed by localized heating of the diamond substrate;

conductor contacts at the surface of said diamond substrate in current conducting communication with said conductive region; and a source of potential connected to said conductor contacts.

4. A package for an electrical device comprising;

an electrical device in said package;

a source of potential external said package; and a diamond lattice film having conductor terminals interconnecting said electrical device and said source of potential, each terminal comprising a three-dimensional conductive region of conductive graphite below the surface of the diamond lattice and formed by localized heating of the diamond lattice.

5. A method of making and using conductive regions in a diamond lattice substrate comprising:

providing a diamond lattice substrate;

selectively heating portions of said diamond lattice to irreversibly transform portions into zones of conductive graphite below the surface of the diamond substrate and electrical contact points on the surface of the diamond substrate;

cooling said substrate during irradiation to confine said graphite to said area of said plane at a desired depth within said substrate; and connecting said conductive graphite to a source of potential whereby said conductive graphite operate as electrically conductive regions.

6. A method according to claim 5, wherein said substrate is cooled to a range of 290° K to 4° K.

7. A method according to claim 5, wherein said irradiation period is in the range of a few minutes to a few hours.

8. A method according to claim 5, wherein said high energy charged particle is selected from the group of protons, deuterons and alpha particles.

9. A method according to claim 5 wherein the selectively heating includes irradiating the diamond lattice with monoenergetic charged particles and the zone of conductive graphite is co-extensive with the region in the lattice where said particles stop.

10. A method according to claim 5 wherein said selectively heating includes selectively irradiating with charged particles.

11. A method according to claim 5 wherein said conductive regions operate as resistors.

12. A method according to claim 5 wherein said conductive regions operate as plates of a capacitor.

13. A method according to claim 5 wherein said conductive regions operate as interconnectors.

14. A method according to claim 5 wherein said diamond lattice is provided as a film on an integrated circuit.

15. A method according to claim 5 wherein said diamond lattice is provided as a film on a circuit board.

16. A method according to claim 5 wherein said diamond lattice is provided on a container for an electric device.

17. A method of making and using conductive regions in a diamond lattice substrate comprising:

providing a diamond lattice substrate;

selectively heating portions of said diamond lattice by irradiating with charged particles at an energy level in the range of 0.1 Mev to 4 Mev to irreversibly transform portions into zones of conductive graphite;

cooling said substrate during irradiation to confine said graphite to said area of said plane at a desired depth within said substrate; and connecting said conductive graphite to a source of potential whereby said conductive graphite operate as electrically conductive regions.

* * * * *